United States Patent
Masleid et al.

(10) Patent No.: US 7,336,103 B1
(45) Date of Patent: Feb. 26, 2008

(54) STACKED INVERTER DELAY CHAIN

(75) Inventors: Robert P. Masleid, Monte Sereno, CA (US); James B. Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/864,271

(22) Filed: Jun. 8, 2004

(51) Int. Cl.
*H03K 19/094* (2006.01)
(52) U.S. Cl. .......................................... 326/121; 326/87
(58) Field of Classification Search .................. 326/87, 326/119, 121, 122; 327/276
See application file for complete search history.

(56) References Cited

U.S. PATENT DOCUMENTS

| | | | |
|---|---|---|---|
| 4,498,021 A | 2/1985 | Uya | 326/86 |
| 5,166,555 A | 11/1992 | Kano | 326/87 |
| 5,414,312 A | 5/1995 | Wong | |
| 5,455,521 A | 10/1995 | Dobbelaere | |
| 5,497,105 A | 3/1996 | Oh et al. | 326/27 |
| 5,698,994 A | 12/1997 | Tsuji | 326/83 |
| 5,739,715 A | 4/1998 | Rawson | |
| 5,767,700 A | 6/1998 | Lee | 326/86 |
| 5,969,543 A | 10/1999 | Erickson et al. | |
| 6,025,738 A | 2/2000 | Masleid | |
| 6,114,840 A | 9/2000 | Farrell et al. | |
| 6,172,545 B1 * | 1/2001 | Ishii | 327/276 |
| 6,262,601 B1 * | 7/2001 | Choe et al. | 326/121 |
| 6,321,282 B1 | 11/2001 | Horowitz et al. | |
| 6,573,777 B2 * | 6/2003 | Saint-Laurent et al. | 327/276 |
| 6,577,176 B1 | 6/2003 | Masleid et al. | |
| 6,731,140 B2 | 5/2004 | Masleid et al. | |
| 2001/0000426 A1 | 4/2001 | Sung et al. | 331/25 |
| 2001/0030561 A1 | 10/2001 | Asano et al. | 327/170 |
| 2002/0056016 A1 | 5/2002 | Horowitz et al. | 710/104 |
| 2003/0057775 A1 | 3/2003 | Yamashita et al. | |
| 2003/0160630 A1 | 8/2003 | Earle | |
| 2003/0231713 A1 | 12/2003 | Masleid et al. | |

FOREIGN PATENT DOCUMENTS

| | | | |
|---|---|---|---|
| JP | 03089624 A | | 4/1991 |
| JP | 04091516 A | * | 3/1992 |

OTHER PUBLICATIONS

Nalamalpu, Et al., Boosters for Driving Long Onchip Interconnects-Design Issues, Interconnect Synthesis, and Comparison with Repeaters, Jan. 2002, IEEE Transactions on Computer-Aided Design of Integrated Circuits and Systems, vol. 21, No. 1, pp. 50-62.
Lima T et al. "Capacitance Coupling Immune, Transient Sensitive Accelerator for Resistive Interconnect Signals of Subquater Micron ULSI" IEEE Journal of Solid-State Circuits, IEEE Inc. New York, US pp. 531-536. Apr. 1996.

* cited by examiner

*Primary Examiner*—Daniel Chang

(57) ABSTRACT

Stacked inverter delay chains. In accordance with a first embodiment of the present invention, a series stack of two p-type devices is coupled to a series stack of three n-type devices, forming a stacked inverter comprising desirable delay, die area and power characteristics. Two stacked inverters are coupled together to form a stacked inverter delay chain that is more efficient in terms of die area, active and passive power consumption than conventional delay chains comprising conventional inverters.

24 Claims, 3 Drawing Sheets

STACKED INVERTER DELAY CHAIN

FIELD OF THE INVENTION

Embodiments in accordance with the present invention relate to stacked inverter delay chains.

BACKGROUND

It is sometimes advantageous to delay propagation of a signal through an integrated circuit. A common approach to create such signal delays is to insert a delay circuit into a signal path. It is usually desirable for a delay circuit design to track delay changes (e.g., due to process, voltage and/or temperature variations) of other circuits on an integrated circuit. Likewise, delay circuit designs should be efficient in terms of integrated circuit die area, active power consumption and static power (leakage current) consumption.

SUMMARY OF THE INVENTION

Stacked inverter delay chains are disclosed. In accordance with a first embodiment of the present invention, a series stack of two p-type devices is coupled to a series stack of three n-type devices, forming a stacked inverter comprising desirable delay, die area and power characteristics. Two stacked inverters are coupled together to form a stacked inverter delay chain that is more efficient in terms of die area, active and passive power consumption than conventional delay chains comprising conventional inverters.

In accordance with another embodiment of the present invention, stacks of varying numbers of devices per leg of a stacked inverter are disclosed. Increasing a number of devices per leg can result in beneficial increases in signal propagation delay and reductions in leakage current.

DETAILED DESCRIPTION OF THE INVENTION

In the following detailed description of the present invention, stacked inverter delay chain, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

STACKED INVERTER DELAY CHAIN

Embodiments in accordance with the present invention are described in the context of design and operation of integrated semiconductors. More particularly, embodiments of the present invention relate to stacked inverter delay chains. It is appreciated, however, that elements of the present invention may be utilized in other areas of semiconductor design and operation.

The following description of embodiments in accordance with the present invention is directed toward pFETs (or p-type metal oxide semiconductor field effect transistors (MOSFETS)) formed in surface N-wells and/or nFETs (or n-type MOSFETS) formed in surface P-wells when a p-type substrate and an N-well process are utilized. It is to be appreciated, however, that embodiments in accordance with the present invention are equally applicable to nFETs (or n-type MOSFETS) formed in surface P-wells and/or pFETs (or p-type MOSFETS) formed in surface N-wells when an n-type substrate and a P-well process are utilized. Consequently, embodiments in accordance with the present invention are well suited to semiconductors formed in both p-type and n-type materials, and such embodiments are considered within the scope of the present invention.

Figure 1:
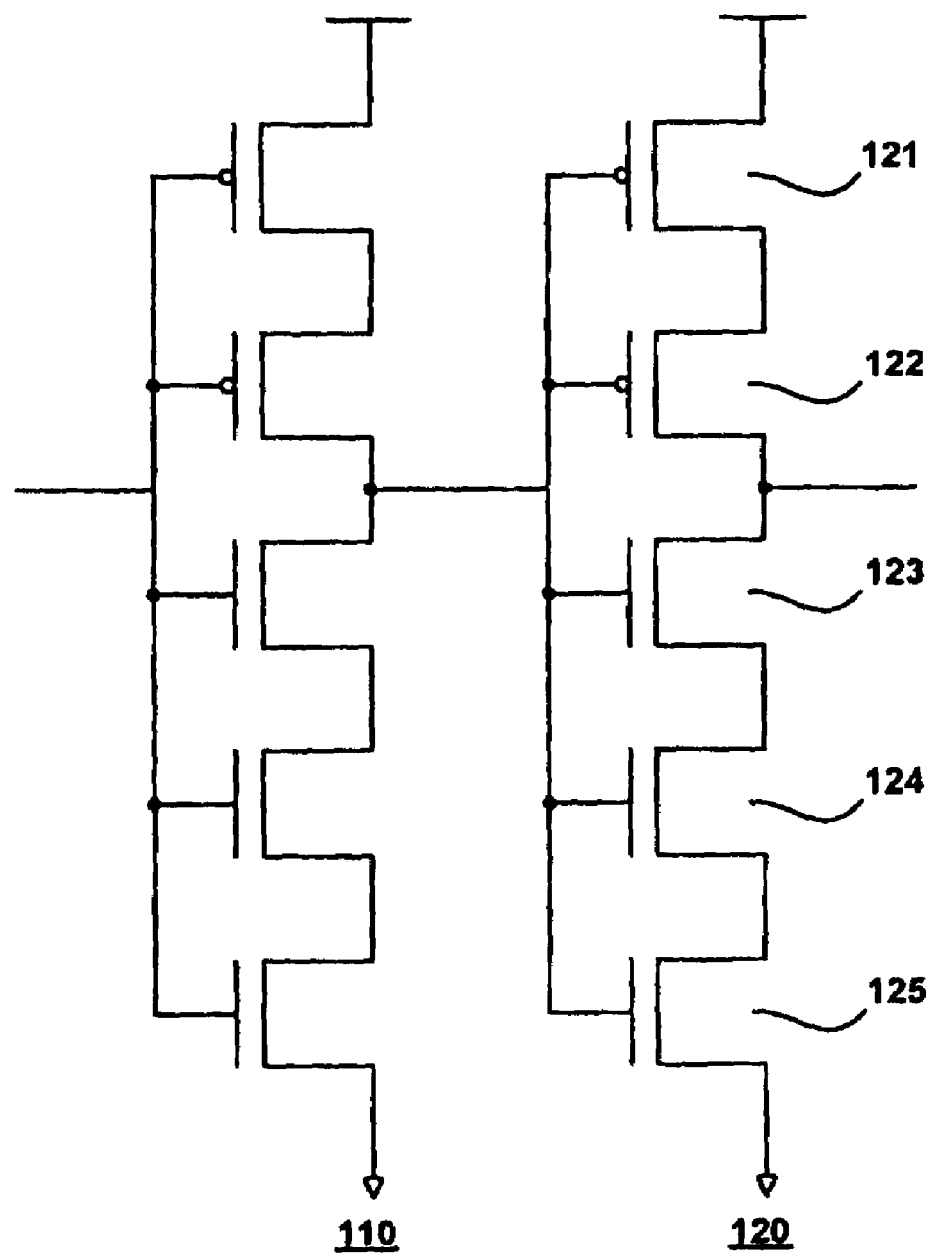
FIG. 1 illustrates a schematic of a stacked inverter delay chain, in accordance with embodiments of the present invention.

FIG. 1 illustrates a schematic of a novel stacked inverter delay chain 100, in accordance with embodiments of the present invention. Stacked inverter delay chain 100 comprises stacked inverters 110 and 120. The output of stacked inverter 110 is coupled to the input of stacked inverter 120. It is to be appreciated that additional stacked inverter delay chains, e.g., one or more instances of stacked inverter delay chain 100, can be coupled to stacked inverter delay chain 100 to achieve larger signal delay values.

In contrast to a conventional inverter, stacked inverters 110 and 120 comprise more than a single p-type device coupled to a single n-type device. Rather, stacked inverters 110 and 120 comprise multiple p-type devices and multiple n-type devices. More particularly, stacked inverter 120 comprises two p-type devices 121 and 122 and three n-type devices 123, 124 and 125. The gates of the devices of stacked inverter 120 are coupled together forming the input of the inverter stage. The output of the inverter stage may be taken at the coupling of a p-type device to an n-type device.

In contrast to a conventional inverter, however, stacked inverter 120 comprises multiple series devices per "leg." For example, two p-type devices are configured to pull the output high (when appropriate) and three n-type devices are configured to pull the output low. Consequently, the drive capability of stacked inverter 120 is less than the drive capability of a conventional inverter. Beneficially, such decreased drive capability produces an increased delay of a signal through stacked inverter 120.

Additionally, and also of benefit, stacked inverter 120 presents an increased load to its driving circuitry, in comparison to a conventional inverter. For example, a signal input to stacked inverter 120 is coupled to five active devices as opposed to being coupled to two active devices in a conventional inverter. Each device presents an input capacitance. Such increased loading produces a further desirable increase in signal propagation delay.

An approximate analysis of stacked inverter delay chain 100 indicates that the delay of stacked inverter 120 is about six times the delay of a conventional two-device inverter. For example, drive resistance of stacked inverter 120 can be about 2.5 times the drive resistance of a conventional inverter, and load capacitance of stacked inverter 120 can be about 2.5 times the load capacitance of a conventional inverter. If stacked inverter 110 is constructed similarly, the delay through stacked inverter delay chain 100 will be about 12 times longer than through a conventional inverter pair. In different terms, a delay through stacked inverter delay chain 100 is approximately the same as a delay through a chain of 12 stages of conventional inverters. It is appreciated that an exacting evaluation is the province of circuit simulation and the details of a particular semiconductor manufacturing process.

A chain of 12 conventional inverters comprising 24 active devices has approximately the same delay as stacked inverter delay chain 100 comprising ten active devices. Consequently, the active switching power of stacked inverter delay chain 100 is beneficially reduced to approximately 42 percent (10 divided by 24) of the active switching power of a conventional delay circuit, for about the same delay.

In addition to a reduction in the number of active devices required for a comparable delay, a beneficial reduction is realized in integrated circuit die area required by stacked inverter delay chain 100. As a consequence of utilizing fewer active components than a conventional delay circuit, stacked inverter delay chain 100 comprises about 42 percent of the die area for active devices than a conventional delay circuit, for approximately the same delay. However, there is yet another additional integrated circuit die area benefit realized by stacked inverter delay chain 100 over the conventional art.

Figure 2:
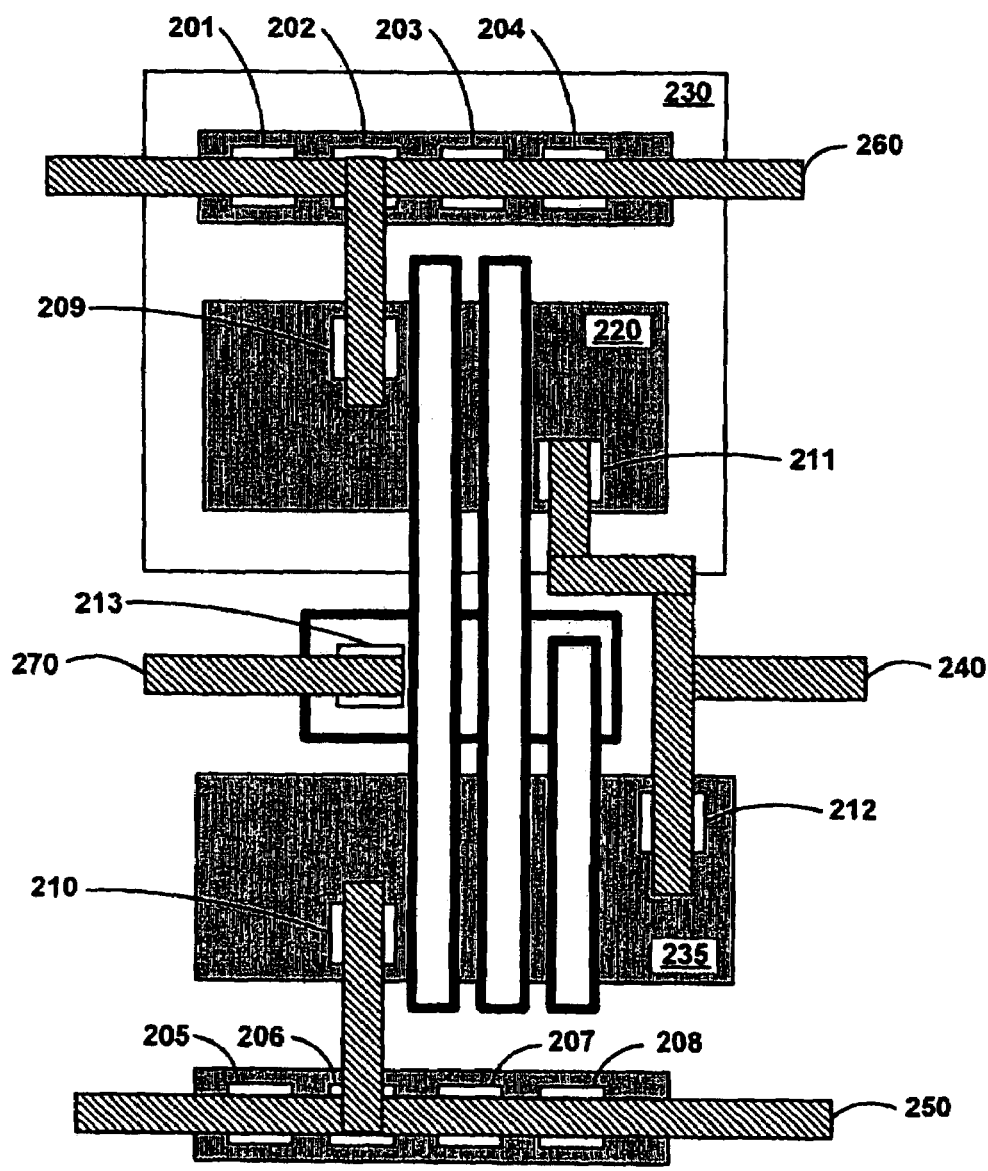
FIG. 2 illustrates an exemplary layout of a stacked inverter, in accordance with embodiments of the present invention.

FIG. 2 illustrates an exemplary layout of stacked inverter 120, in accordance with embodiments of the present invention. It is appreciated that FIG. 2 is not drawn to scale.

Stacked inverter 120 comprises two p-type devices (121, 122 of FIG. 1) formed in p-type diffusion within n-well 220. Stacked inverter 120 comprises three n-type devices (123, 124, 125 of FIG. 1) formed in n-type diffusion. Metallization 240 couples p-type diffusion 220 with n-type diffusion 235, coupling p-type device 122 (FIG. 1) with n-type device 123 (FIG. 1) and forming the output of stacked inverter 120 (FIG. 1).

Metallization 260 couples p-type device 121 (FIG. 1) to an operating voltage, e.g., Vdd. Metallization 250 couples n-type device 125 (FIG. 1) to ground. Metallization 270 couples an input signal to the gates of all devices.

In a conventional art delay circuit, all diffusion regions require a contact. For example, in the conventional art, contacts are required to connect a transistor to a later stage and/or to connect a transistor to a transistor of opposite type. Thus, a conventional art inverter chain requires about 5 contacts per stage. For example, a conventional art inverter stage would typically comprise one contact to couple Vdd to the p-type device, one contact to couple ground to the n-type device, one contact to couple the inverter output to the p-type device, one to couple the inverter output to the n-type device and one contact for the input. Twelve stages of inverters thus require about 60 contacts. It is appreciated that additional contacts are generally required for coupling Vdd and ground to the wells.

In contrast, in accordance with embodiments of the present invention, stacked inverter delay chain 100 requires far fewer contacts to produce about the same delay as a conventional 12-stage inverter delay chain. In contrast to the conventional art, stacked inverter 120 has no need of contacts within its stacks. For example, no contact is necessary between p-type devices 121 and 122 (FIG. 1), nor is a contact necessary between n-type devices 123 and 124 (FIG. 1), nor is a contact necessary between n-type devices 124 and 125 (FIG. 1). For example, one contact couples p-type device 121 (FIG. 1) to Vdd (contact 209), and one contact couples n-type device 125 (FIG. 1) to ground (contact 210). One contact couples p-type device 122 (FIG. 1) to the output (contact 211), and one contact couples n-type device 123 (FIG. 1) to the output (contact 212). One contact couples the input to all devices (contact 213). Consequently, stacked inverter 120 can be constructed utilizing a total of about ten contacts. Exemplary contacts 201-208 are illustrated coupling Vdd and ground to the wells. It is appreciated that such contacts are commonly interspersed at intervals, e.g., every tenth row of logic, and thus may not be strongly associated with a particular circuit.

Therefore, in contrast to a conventional art inverter delay chain requiring about 60 contacts, stacked inverter delay chain 100 requires only about 10 contacts, or one sixth as many contacts to produce about the same delay. Consequently, embodiments in accordance with the present invention yield highly advantageous integrated circuit die area reductions far beyond a reduction in transistor count.

A further benefit of stacked inverter delay chain 100 derives from utilizing fewer stages in comparison to the conventional art. Consequently, embodiments in accordance with the present invention require less wiring to intercouple stages and fewer inter-stage spaces to separate stages. Such requirements for less wiring and less space result in a desirable reduction in integrated circuit die area required for such wiring and spaces.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Embodiments in accordance with the present invention offer significant advantages in reducing static power consumption in comparison with the conventional art. A conventional art inverter delay chain comprises a leakage path for each inverter, e.g., a series "string" of devices from operating voltage (Vdd) to ground. Thus, a 12 inverter delay chain comprises 12 leakage paths. In contrast, stacked inverter delay chain 100 comprises just two leakage paths. Consequently, stacked inverter delay chain 100 comprises one sixth of the leakage paths.

Further, such leakage paths within stacked inverter delay chain 100 suffer less leakage than conventional inverters, yielding additional beneficial leakage reductions. In a conventional inverter, exactly one transistor is on while the other transistor is off. As an unfortunate consequence, approximately the full bias voltage is applied to the off transistor, resulting in a maximum possible leakage for the off transistor.

In contrast, referring once again to FIG. 1, in stacked inverter 120 multiple transistors are either on or off in series. For example, for a "high" output state, transistors 121 and 122 are on, while transistors 123, 124 and 125 are off. Consequently, each off transistor (123-125) has significantly less than full bias voltage applied. For example, for a high output, each transistor 123, 124 and 125 will have about one third of full bias voltage applied. It is appreciated that leakage current generally decreases exponentially as voltage decreases. For example, a two times reduction in off bias voltage produces about an eight times reduction in leakage current per leakage path.

It is to be further appreciated that such leakage induces non zero voltages at intermediate nodes between the off transistors, e.g., between transistors 125 and 124, and between transistors 124 and 123. Such voltages induce body biasing effects in the transistors. Such body biasing effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body biasing effect and a highly non-linear relationship between bias voltage and leakage current. An approximate analysis indicates that total leakage current of stacked inverter delay chain 100 is reduced about 50 times in comparison to a conventional delay chain of inverters, for the same delay.

Another aspect of merit regarding delay circuits is the ability of a delay circuit to track speed changes of other circuitry of an integrated circuit. It is appreciated that a variety of factors, e.g., operating voltage, operating temperature and/or manufacturing process variations, can affect the speed of operation of an integrated circuit. It is generally desirable for a delay circuit to track speed changes of other circuitry of an integrated circuit. For example, if other circuits of an integrated circuit operate faster, generally less absolute delay is required from a delay circuit for the overall circuit to function. Because embodiments in accordance with the present invention comprise stacked devices, they are similar to many logic circuits that also comprise stacked devices, e.g., NAND and/or NOR logic gates. Consequently, embodiments in accordance with the present invention match or track changes in operating speed of complex logic more accurately than delay chains comprising very simple inverters.

Embodiments in accordance with the present invention are thus shown to offer significant and highly beneficial improvements in tracking timing changes of other circuits, integrated circuit die area, active power consumption and static power (leakage current) consumption in comparison to the conventional art.

Figure 3:
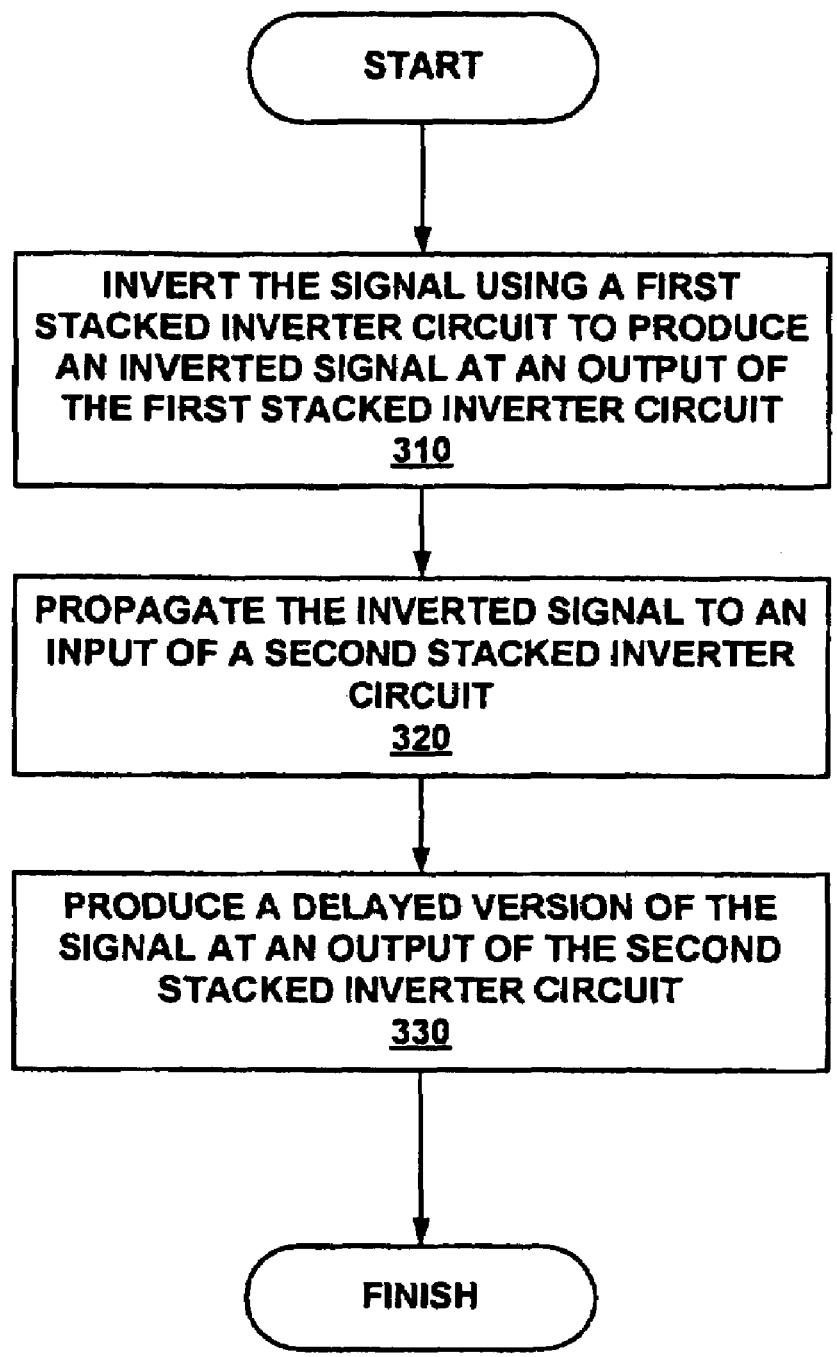
FIG. 3 illustrates a flow chart of steps in a method of delaying a signal, in accordance with embodiments of the present invention.

FIG. 3 illustrates a flow chart of steps in a method of delaying a signal 300, in accordance with embodiments of the present invention. In block 310, the signal is inverted using a first stacked inverter circuit to produce an inverted signal at an output of the first stacked inverter circuit. For example, the inverted signal is the output of stacked inverter chain 110 of FIG. 1.

In block 320, the inverted signal is propagated to an input of a second stacked inverter circuit, e.g., at the input of stacked inverter chain 120 of FIG. 1. In block 330, a delayed version of the signal is produced at an output of the second stacked inverter circuit. For example, in reference to FIG. 1, a delayed version of the input to stacked inverter circuit 110 is produced at the output of stacked inverter chain 110. In accordance with embodiments of the present invention, the first and the second stacked inverter circuits comprise at least five active devices.

It is to be appreciated physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments of the present invention, it is possible to stack different numbers of transistors on either or both legs of a stacked inverter. Such variations allow increases in load and/or decreases in drive capability, enabling a wide variety of delay values, as well as enabling differing body biasing effects.

For example, depending upon a wide variety of factors, including, e.g., details of a semiconductor process, required delay, active power budget and/or static power budget, a delay circuit comprising multiple stacked inverter circuits, each comprising three or more p-type devices in conjunction with three or more n-type devices, may better optimize available resources than stacked inverter delay circuit 100 (FIG. 1).

It is to be appreciated that conventional integrated circuit design practice generally teaches away from embodiments in accordance with the present invention. For example, much of the art generally teaches design of "fast" circuits. In most areas of integrated circuit design, a great deal of effort is devoted to design details that contribute to an increased speed (frequency) of operation, e.g., reducing input capacitance and increasing output drive. For example, in contrast to conventional teaching and practice, stacked inverter chain 120 comprises stacked transistors without an intermediate buffer, reducing output drive capability and slowing the circuit down. Further, stacked inverter chain 120 comprises multiple inputs that all have the same logical purpose, increasing input capacitance and further slowing the circuit down.

Further, embodiments in accordance with the present invention are contrary to the operation of conventional integrated circuit design tools. For example, conventional design synthesis tools will routinely "optimize" redundancy out of a design. For example, stacked inverter 120 (FIG. 1) comprises two field effect transistors in series driven by the same input. From a logic design perspective, such a structure may be considered redundant. Thus, conventional design synthesis tools will routinely reduce stacked inverter 120 to a conventional two-device inverter. Consequently, a designer may be required to take custom efforts to retain and embody a novel stacked inverter in accordance with embodiments of the present invention when utilizing conventional design tools.

Embodiments in accordance with the present invention provide a stacked inverter comprising desirable delay, die area and power characteristics. Further embodiments in accordance with the present invention provide for coupling two stacked inverters together to form a stacked inverter delay chain that is more efficient in terms of die area, active and passive power consumption than conventional delay chains comprising conventional inverters. Still further embodiments in accordance with the present invention provide for stacks of varying numbers of devices per leg of a stacked inverter.

Embodiments in accordance with the present invention, stacked inverter delay chain, are thus described. While the present invention has been described in particular embodiments, it should be appreciated that the present invention should not be construed as limited by such embodiments, but rather construed according to the below claims.

What is claimed is:

1. A method of delaying a signal comprising:
   inverting said signal using a first stacked inverter circuit to produce an inverted signal at an output of said first stacked inverter circuit;
   propagating said inverted signal to an input of a second stacked inverter circuit; and
   producing a delayed version of said signal at an output of said second stacked inverter circuit, wherein said second stacked inverter circuit includes a total number of transistors of a first type that is different than a total number of a second type.

2. A method according to claim 1 wherein said second stacked inverter circuit comprises two p-type devices and three n-type devices.

3. A method according to claim 1 wherein said inverting is performed over a greater time duration compared to an inverting performed by an inverter comprising only two active devices.

4. A method according to claim 1 wherein said propagating said inverted signal is performed using a substantially direct connection to said output of said first stacked inverter circuit.

5. A method according to claim 1 wherein said producing is performed over a greater time duration compared to an inverting performed by an inverter comprising only two active devices.

6. A method according to claim 1 embodied in an integrated circuit.

7. A method according to claim 6 wherein said integrated circuit comprises a microprocessor.

8. A stacked inverter circuit comprising:
   a first number of devices of a first type coupled in series;
   a second number of devices of an opposite type coupled in series; and
   wherein said first number of devices and said second number of devices are coupled in series and a total of said first number of devices is not equal to a total of said second number of devices.

9. A stacked inverter circuit of claim 8 characterized in having a greater switching time duration than an inversion performed by an inverter comprising only two active devices.

10. A stacked inverter circuit of claim 8 characterized in having less leakage current than an inverter comprising only two active devices.

11. A stacked inverter circuit of claim 8 wherein a gate of each device is coupled to receive an input signal.

12. A stacked inverter circuit of claim 8 wherein:
    said first type is a p-type; and
    said opposite type is an n-type.

13. A stacked inverter delay circuit comprising:
    two stacked inverter circuits coupled in series, each of said stacked inverter circuits comprising:
    at least two devices of a first type coupled in series;
    at least three devices of an opposite type coupled in series; and
    wherein a total number of said devices of said first type is different from a total number of said devices of said opposite type.

14. A stacked inverter delay circuit of claim 13 wherein said two stacked inverter circuits are substantially identical.

15. A stacked inverter delay circuit of claim 14 wherein each of said stacked inverter circuits comprises two p-type devices.

16. A stacked inverter delay circuit of claim 15 wherein each of said stacked inverter circuits comprises three n-type devices.

17. A stacked inverter delay circuit of claim 13 characterized in having a greater delay time duration than a delay created by two stages of inverters, each of said stages comprising only two devices.

18. A stacked inverter delay circuit of claim 13 characterized in having less leakage current than a delay circuit comprising two stages of inverters, each of said stages comprising only two devices.

19. A stacked inverter delay circuit of claim 13 wherein a gate of all devices of each stacked inverter is coupled to the input signal.

20. A stacked inverter delay circuit of claim 13 wherein said first type is p-type.

21. A stacked inverter delay circuit of claim 13 wherein said first type is n-type.

22. An integrated circuit comprising:
    a first device of a first type comprising a first terminal coupled to an operating voltage;
    a second device of said first type comprising a first terminal coupled to a second terminal of said first device;
    a third device of an opposite type comprising a first terminal coupled to a second terminal of said second device;
    a fourth device of said opposite type comprising a first terminal coupled to a second terminal of said third device;
    a fifth device of said opposite type comprising a first terminal coupled to a second terminal of said fourth device;
    said fifth device further comprising a second terminal coupled to a ground reference of said integrated circuit, wherein
    third terminals of said first, second, third, fourth and fifth devices are coupled together forming an input to said integrated circuit;
    an output of said integrated circuit coupled to said second terminal of said second device; and
    wherein a total number of said devices of said first type is different from a total number of said devices of said opposite type.

23. The integrated circuit of claim 22 wherein said first type is p-type.

24. The integrated circuit of claim 23 wherein said opposite type is n-type.

* * * * *